(12) United States Patent
Lim et al.

(10) Patent No.: US 10,903,127 B2
(45) Date of Patent: *Jan. 26, 2021

(54) FILM FOR A PACKAGE SUBSTRATE

(71) Applicant: SAMSUNG ELECTRONICS CO., LTD., Suwon-si (KR)

(72) Inventors: So Young Lim, Hwaseong-si (KR); Ye Chung Chung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/897,468

(22) Filed: Jun. 10, 2020

(65) Prior Publication Data

US 2020/0303270 A1     Sep. 24, 2020

Related U.S. Application Data

(63) Continuation of application No. 16/115,751, filed on Aug. 29, 2018, now Pat. No. 10,699,974.

(30) Foreign Application Priority Data

Oct. 23, 2017 (KR) .................... 10-2017-0137369
Feb. 1, 2018 (KR) .................... 10-2018-0012957

(51) Int. Cl.
*H01L 21/66*     (2006.01)
*H01L 23/498*     (2006.01)
(Continued)

(52) U.S. Cl.
CPC .......... *H01L 22/32* (2013.01); *H01L 23/4985* (2013.01); *H01L 24/06* (2013.01);
(Continued)

(58) Field of Classification Search
None
See application file for complete search history.

(56) References Cited

U.S. PATENT DOCUMENTS 7,442,968 B2   10/2008   Kim et al.
8,853,694 B2   10/2014   Han et al.
(Continued)

FOREIGN PATENT DOCUMENTS

| JP | 2005-150601 A | 6/2005 |
| KR | 10-1263788 B1 | 5/2013 |
| KR | 2014-0067762 A | 6/2014 |

*Primary Examiner* — Robert K Carpenter
(74) *Attorney, Agent, or Firm* — Lee IP Law, P.C.

(57) ABSTRACT

A display device including a film substrate including first and second surfaces, the first surface being opposite to the second surface; a semiconductor chip disposed on the first surface and including an input terminal and a test terminal, which are arranged in a first direction; a first wire extending from the input terminal on the first surface along a second direction, which intersects the first direction; and a second wire including a first extended portion, which extends along the first surface, a second extended portion, which extends along the second surface, and a first via, which penetrates the film substrate and connects the first extended portion and the second extended portion, wherein the first extended portion extends from the test terminal in the second direction and is connected to the first via, and the second extended portion extends from the first via to an edge of the second surface.

20 Claims, 16 Drawing Sheets

(51) Int. Cl.
*H01L 23/00* (2006.01)
*H05K 1/03* (2006.01)
*H05K 1/02* (2006.01)
*G09G 3/00* (2006.01)

(52) U.S. Cl.
CPC ............. H01L 24/09 (2013.01); H01L 24/32 (2013.01); H05K 1/0268 (2013.01); H05K 1/0393 (2013.01); *G09G 3/006* (2013.01); *H01L 24/05* (2013.01); *H01L 24/08* (2013.01); *H01L 2224/05553* (2013.01); *H01L 2224/0613* (2013.01); *H01L 2224/08225* (2013.01); *H01L 2224/16221* (2013.01); *H01L 2224/32221* (2013.01); *H01L 2924/00014* (2013.01); *H01L 2924/15173* (2013.01); *H05K 2201/0305* (2013.01); *H05K 2201/0949* (2013.01)

(56) References Cited

U.S. PATENT DOCUMENTS

| | | | |
|---|---|---|---|
| 10,699,974 B2 * | 6/2020 | Lim | .................... H01L 23/4985 |
| 2004/0245628 A1 | 12/2004 | Chung | |
| 2016/0049356 A1 | 2/2016 | Jung et al. | |

* cited by examiner

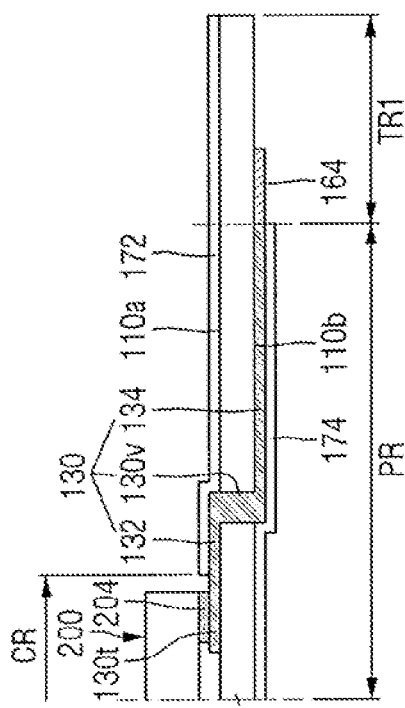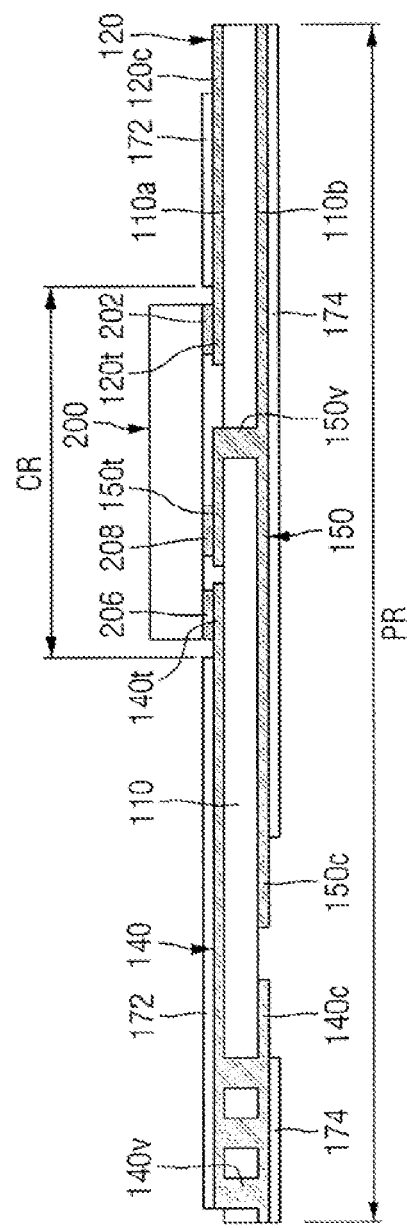

FILM FOR A PACKAGE SUBSTRATE

CROSS-REFERENCE TO RELATED APPLICATIONS

This is a continuation application based on pending application Ser. No. 16/115,751, filed Aug. 29, 2018, the entire contents of which is hereby incorporated by reference.

Korean Patent Application No. 10-2017-0137369, filed on Oct. 23, 2017, and Korean Patent Application No. 10-2018-0012957, filed on Feb. 1, 2018, in the Korean Intellectual Property Office, and entitled: "Film for Package Substrate, Semiconductor Package, Display Device, and Methods of Fabricating the Film, the Semiconductor Package, the Display Device," is incorporated by reference herein in its entirety.

BACKGROUND

1. Field

Embodiments relate to a film for a package substrate, a semiconductor package, a display device, and methods of fabricating the film, the semiconductor package, and the display device.

2. Description of the Related Art

As electronic products have increasingly become compact in size, thin, and lightweight, tape film packages have been suggested as high-integration density semiconductor chip mounting technology. Examples of the tape film packages include a tape carrier package and a chip-on film (COF) package.

In the COF package, a semiconductor chip may be bonded directly on a substrate by flip-chip bonding and may be connected to an external circuit via wires.

SUMMARY

The embodiments may be realized by providing a display device including a film substrate including a first surface and a second surface, the first surface being opposite to the second surface; a semiconductor chip disposed on the first surface, the semiconductor chip including an input terminal and a test terminal, which are arranged in a first direction; a first wire extending from the input terminal on the first surface along a second direction, which intersects the first direction; and a second wire including a first extended portion, which extends along the first surface, a second extended portion, which extends along the second surface, and a first via, which penetrates the film substrate and connects the first extended portion and the second extended portion, wherein the first extended portion extends from the test terminal in the second direction and is connected to the first via, and the second extended portion extends from the first via to an edge of the second surface.

The embodiments may be realized by providing a semiconductor package including a film substrate including a package region and a first test region, which are adjacent to each other, the film substrate including a first surface and a second surface, the first surface being opposite to the second surface; a semiconductor chip disposed on the first surface and including a first chip pad and a second chip pad, which are arranged in a first direction; a first test pad disposed on the second surface of the first test region; a first wire disposed on the first surface of the package region and the first surface of the first test region, the first wire extending from the first chip pad in a second direction that intersects the first direction; and a second wire connecting the second chip pad and the first test pad, wherein the second wire includes a first via that penetrates a part of the package region between the semiconductor chip and the first test region.

The embodiments may be realized by providing a film for a package substrate, the film including a film substrate including a package region, a first region, and a second test region, the first region and the second region being adjacent to both sides of the package region, the film substrate having a first surface and a second surface, the first surface being opposite to the second surface; a chip mounting region disposed on the first surface of the package region; a first wire including a first wire terminal, which is disposed in the chip mounting region; a second wire including a second wire terminal, which is disposed in the chip mounting region, and arranged in a first direction together with the first wire terminal; a third wire including a third wire terminal, which is disposed in the chip mounting region, and arranged in a second direction, which intersects the first direction, together with the first wire terminal; a first test pad and a second test pad disposed on the second surface of the first test region; and a third test pad disposed on the second surface of the second test region, wherein the first wire includes a first via that penetrates the first test region and that is connected to the first test pad, the second wire includes a second via that penetrates a part of the package region between the chip mounting region and the first test region and that is connected to the second test pad, and the third wire is connected to the third test pad.

The embodiments may be realized by providing a method of fabricating a film for a package substrate, the method including providing a film substrate such that the film substrate includes a package region and a first test region, which are adjacent to each other, the film substrate having a first surface and a second surface, the first surface being opposite to the second surface; forming a first wire including a first wire terminal on the first surface of the package region; forming a first test pad on the second surface of the first test region; forming a second wire including a second wire terminal on the first surface of the package region; and forming a second test pad on the second surface of the first test region, wherein the first wire includes a first via that penetrates the first test region and that is connected to the first test pad, and the second wire includes a second via that penetrates a part of the package region between the second wire terminal and the first test region and that is connected to the second test pad.

The embodiments may be realized by providing a method of fabricating a semiconductor package, the method including providing a film for a package substrate, the film including a package region and a first test region, which are adjacent to each other, and the film having a first surface and a second surface, the first surface being opposite to the second surface; and forming a semiconductor chip on the first surface of the film, wherein providing the film includes forming a first wire including a first wire terminal on the first surface of the package region, forming a first test pad on the second surface of the first test region, forming a second wire including a second wire terminal on the first surface of the package region, and forming a second test pad on the second surface of the first test region, wherein the first wire includes a first via that penetrates the first test region and that is connected to the first test pad, and wherein the second wire includes a second via that penetrates a part of the package region between the semiconductor chip and the first test region and that is connected to the second test pad.

The embodiments may be realized by providing a method of fabricating a display device, the method including providing a semiconductor package; and attaching a printed circuit and a display panel on the semiconductor package, wherein the semiconductor package includes a film substrate having a first surface and a second surface, the first surface being opposite to the second surface; a semiconductor chip disposed on the first surface, the semiconductor chip including an input terminal and a test terminal that are arranged in a first direction; a first wire disposed on the first surface, the first wire extending from the input terminal in a second direction that intersects the first direction; and a second wire including a first extended portion that extends along the first surface, a second extended portion that extends along the second surface, and a first via that connects the first and second extended portions, wherein the first extended portion extends from the test terminal in the second direction and is connected to the first via, and wherein the second extended portion extends from the first via to an edge of the second surface.

BRIEF DESCRIPTION OF THE DRAWINGS

Features will be apparent to those of skill in the art by describing in detail exemplary embodiments with reference to the attached drawings in which:

FIGS. 11 and 12 illustrate cross-sectional views of a semiconductor package according to some exemplary embodiments of the present disclosure.

FIGS. 13 and 14 illustrate cross-sectional views of a semiconductor package according to some exemplary embodiments of the present disclosure.

DETAILED DESCRIPTION

A film for a package substrate according to some exemplary embodiments of the present disclosure will hereinafter be described with reference to FIGS. 1 through 10.

Figure 1:
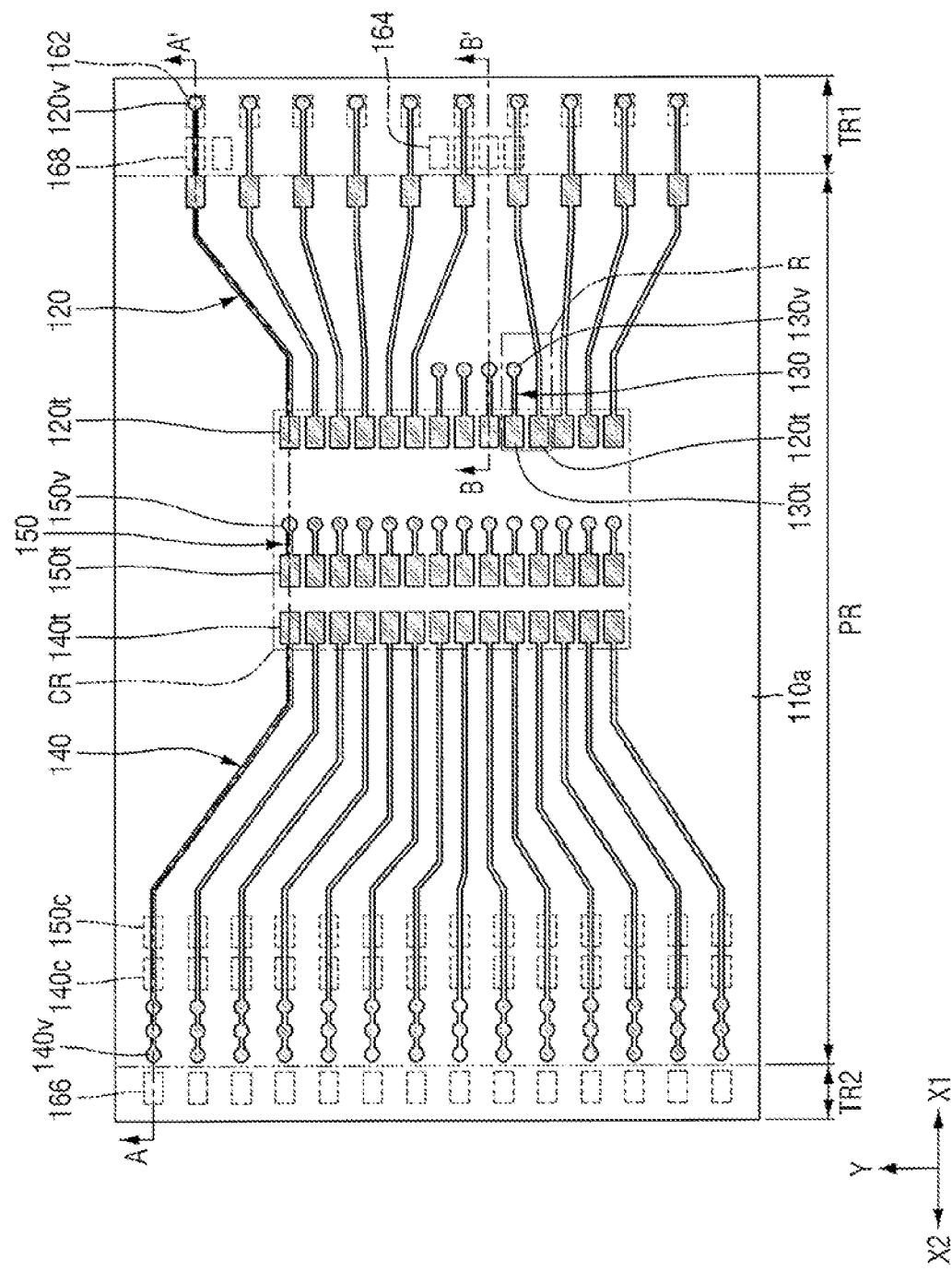
FIG. 1 illustrates a layout view of a first surface of a film for a package substrate according to some exemplary embodiments of the present disclosure.
Figure 2:
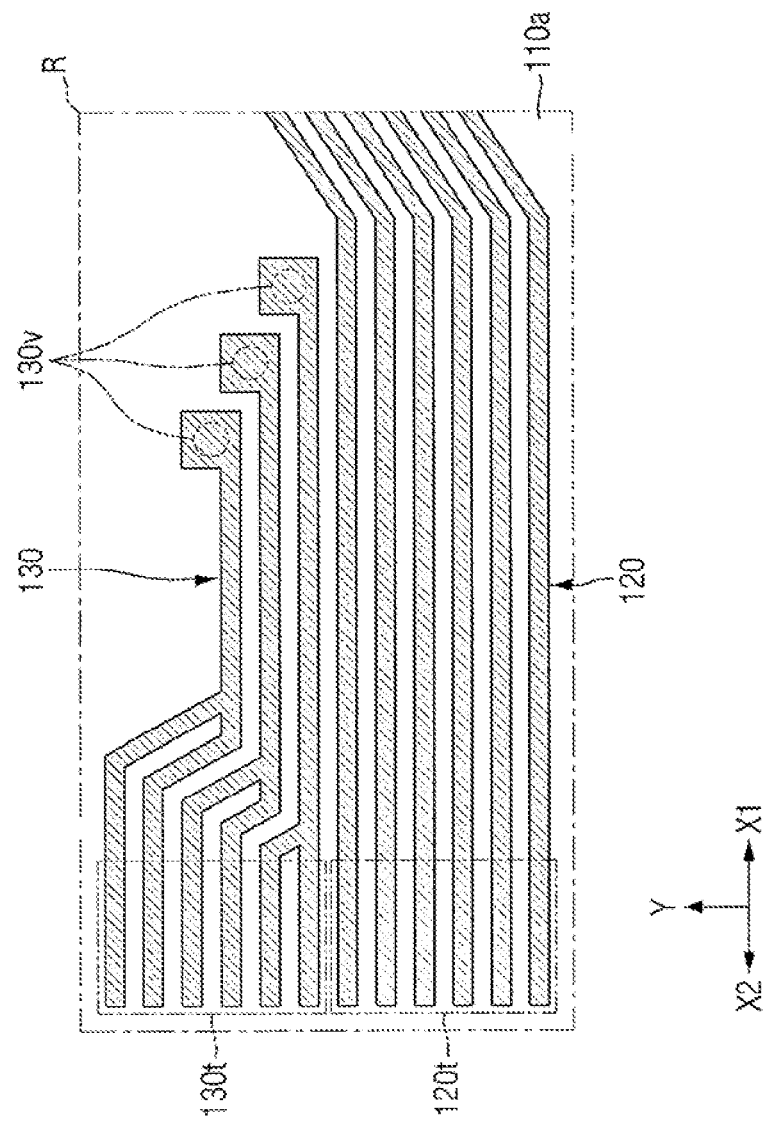
FIG. 2 illustrates an enlarged view of a region R of FIG. 1.
Figure 3:
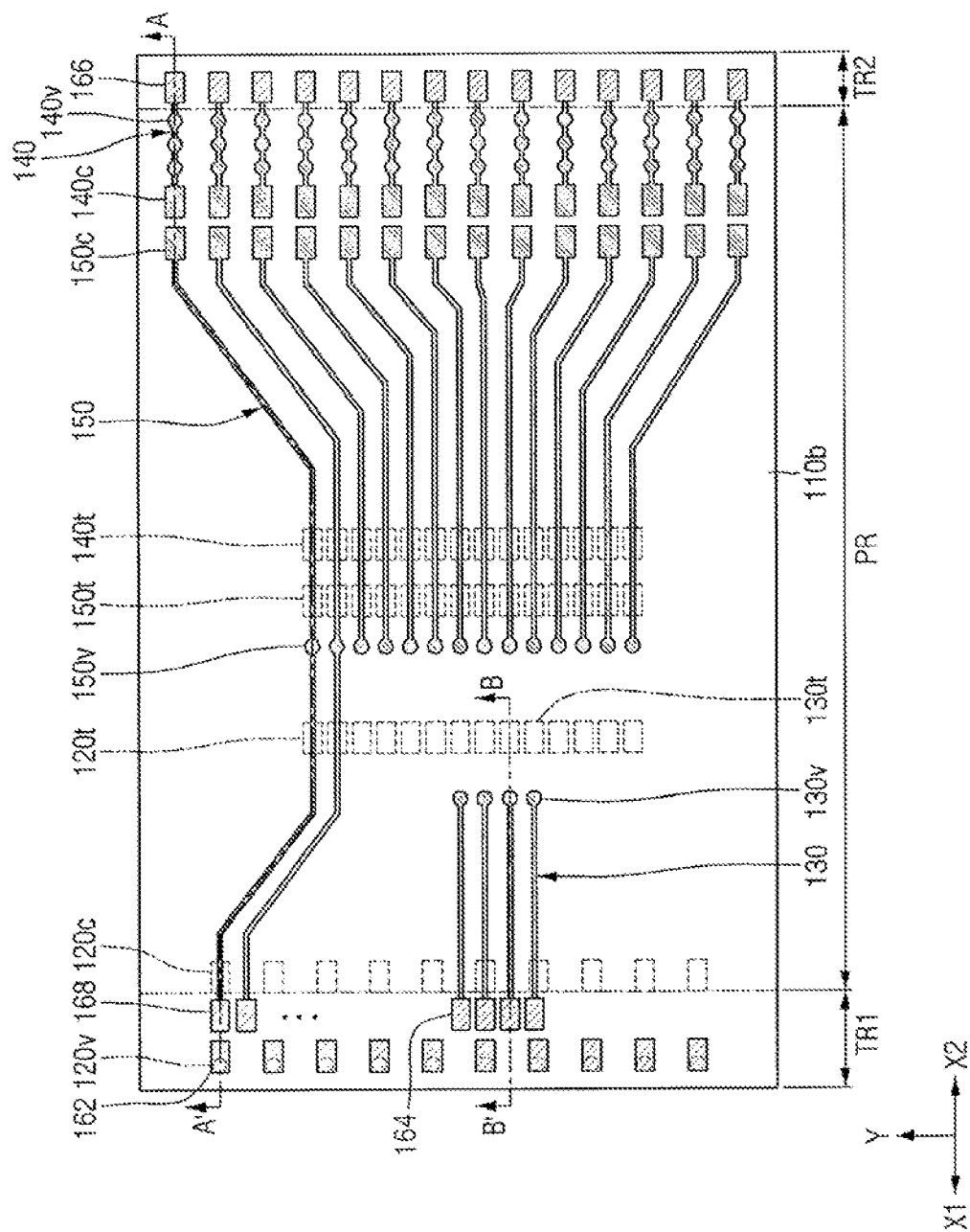
FIG. 3 illustrates a layout view of a second surface of the film according to some exemplary embodiments of the present disclosure.
Figure 4:
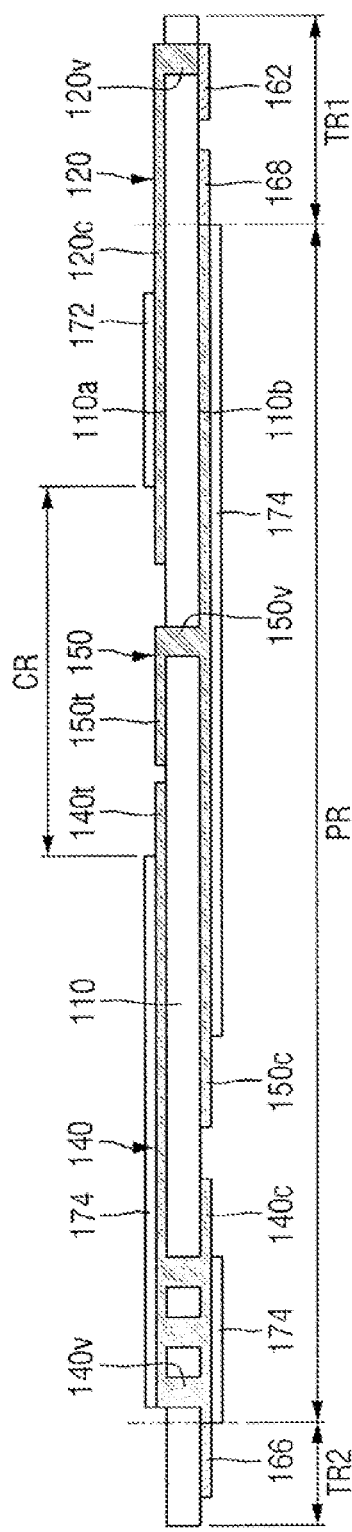
FIG. 4 illustrates a cross-sectional view taken along line A-A' of FIGS. 1 and 3.
Figure 5:
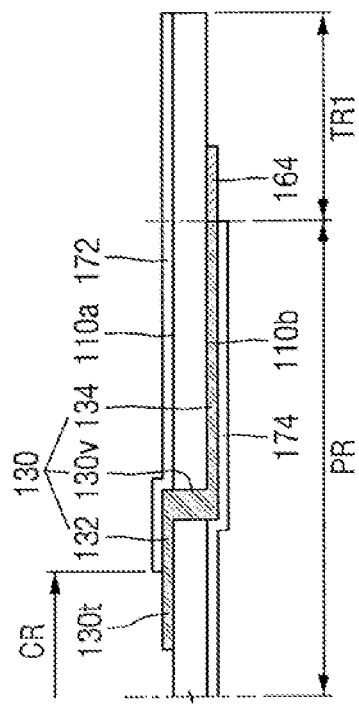
FIG. 5 illustrates a cross-sectional view taken along line B-B' of FIGS. 1 and 3.

FIG. 1 illustrates a layout view of a first surface of a film for a package substrate according to some exemplary embodiments of the present disclosure. FIG. 2 illustrates an enlarged view of a region R of FIG. 1. FIG. 3 illustrates a layout view of a second surface of the film according to some exemplary embodiments of the present disclosure. FIG. 4 illustrates a cross-sectional view taken along line A-A' of FIGS. 1 and 3. FIG. 5 illustrates a cross-sectional view taken along line B-B' of FIGS. 1 and 3.

Referring to FIGS. 1 through 5, the film according to some exemplary embodiments of the present disclosure may include a film substrate 110, first wires 120, second wires 130, third wires 140, fourth wires 150, first test pads 162, second test pads 164, third test pads 166, fourth test pads 168, a first resist film 172, and a second resist film 174.

The film substrate 110 may have first and second surfaces 110*a* and 110*b*, which are opposite to each other. For example, the first surface 110*a* may be the top surface of the film substrate 110, and the second surface 110*b* may be the bottom surface of the film substrate 110 (e.g., as oriented in FIG. 4).

The film substrate 110 may include a package region PR, a first test region TR1, and a second test region TR2. The package region PR may be adjacent to the first and second test regions TR1 and TR2. For example, the first and second test regions TR1 and TR2 may be adjacent to both (e.g., opposing) sides of the package region PR. Accordingly, the package region PR may be interposed between the first and second test regions TR1 and TR2.

Figure 11:
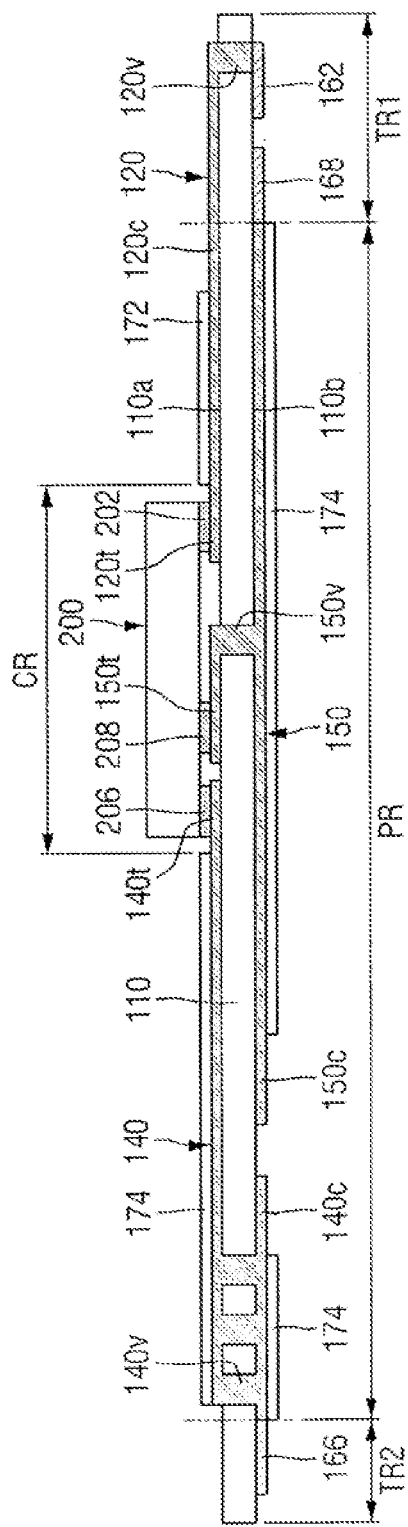

The package region PR may include a chip mounting region CR. The chip mounting region CR may be formed at the center of the package region PR. The chip mounting region CR may be a region of the film substrate 110 in which a semiconductor chip 200 of FIG. 11 is to be mounted.

The film substrate 110 may be, e.g., a flexible film. For example, the film substrate 110 may be a flexible film including polyimide or an epoxy resin.

The first wires 120 may extend along the film substrate 110. A plurality of the first wires 120 may be provided to extend along the film substrate 110.

In an implementation, the first wires 120 may be input wires of a semiconductor package. For example, the first wires 120 may include first wire terminals 120*t* and first connecting portions 120*c*.

The first wire terminals 120*t* may be the ends of the first wires 120 that are formed in the chip mounting region CR. For example, the first wire terminals 120*t* may be parts of the first wires 120 that are connected to the semiconductor chip 200 of FIG. 11. The first wires 120 may extend from the first wire terminals 120*t* in a first direction X1. For example, the first wires 120 may extend along the first surface 110*a* of the package region PR and the first test region TR1.

The first connecting portions 120*c* may be parts of the first wires 120 that are formed in the package region PR. The first connecting portions 120*c* may be parts of the first wires 120 that are connected to a printed circuit 300 of FIG. 15. In an implementation, the first connecting portions 120*c* may be formed on the first surface 110*a* of a part of the package region PR adjacent to the first test region TR1.

The first wires 120 may further include first vias 120*v*. The first vias 120*v* may partially penetrate the film substrate 110. For example, the first vias 10*v* may be parts of the first wires 120 that penetrate the first test region TR1.

In an implementation, each of the first wire terminals 120*t* (as illustrated in FIG. 1) may be a single conductive line. In an implementation, as illustrated in FIG. 2, each of the first wire terminals 120*t* may include six conductive lines.

The second wires 130, like the first wires 120, may extend along the film substrate 110. A plurality of second wires 130 may be provided to extend along the film substrate 110.

In an implementation, the second wires 130 may be test wires of a semiconductor package. For example, the second wires 130 may include second wire terminals 130*t*.

The second wire terminals 130*t* may be the ends of the second wires 130 that are formed in the chip mounting region CR. For example, the second wire terminals 130*t* may be parts of the second wires 130 that are connected to the semiconductor chip 200 of FIG. 11. In an implementation, as illustrated in FIGS. 1 and 3, the first wire terminals 120*t* and the second wire terminals 130*t* may be arranged in a second direction Y that intersects the first direction X1. The second direction Y may be, e.g., a direction that crosses the first direction X1 at a right angle. The second wires 130 may extend from the second wire terminals 130*t* in the first direction X1.

The second wires 130 may further include first extended portions 132, second extended portions 134, and second vias 130*v*.

The first extended portions 132 of the second wires 130 may extend along the first surface 110*a* of the package region PR. The second extended portions 134 of the second wires 130 may extend along the second surface 110*b* of the package region PR. The second vias 130*v* of the second wires 130 may partially penetrate the film substrate 110 and may connect the first extended portions 132 and the second extended portions 134.

The first extended portions 132 may connect the second wire terminals 130*t* and the second vias 130*v*. The second extended portions 134 may connect the second vias 130*v* and the second test pads 164. In an implementation, the second vias 130*v* may penetrate a part of the package region PR between the chip mounting region CR and the first test region TR1. For example, the first extended portions 132 may extend from the second wire terminals 130*t* in the first direction X1 and may be connected to the second vias 130*v*. In an implementation, the second extended portions 134 may extend from the second vias 130*v* in the first direction X1 and may be connected to the second test pads 164. The second extended portions 134 may extend from the second vias 130*v* to the edge of the package region PR on the second surface 110*b*.

In an implementation, the second extended portions 134 may at least partially overlap with the first wires 120. As used herein, the expression "overlap" means that the two elements overlap or are at least partially aligned with each other in a direction perpendicular to the top surface of the film substrate 110. For example, the second extended portions 134 on the second surface 110*b* of the package region PR may at least partially overlap with the first wires 120 on the first surface 110*a* of the package region PR.

In an implementation, the first extended portions 132 may not overlap with the first wires 120. For example, as illustrated in FIG. 1, the first extended portions 132 on the first surface 110*a* of the package region PR may not overlap with the first wires 120 on the first surface 110*a* of the package region PR.

In an implementation, as illustrated in FIG. 1, the second wire terminals 130*t* may be single conductive lines. In an implementation, as illustrated in FIG. 2, each of the second wire terminals 130*t* may include six conductive lines.

In an implementation, the second wire terminals 130*t* (as illustrated in FIG. 1) may be connected to the second vias 130*v*. In an implementation, as illustrated in FIG. 2, each of the second wire terminals 130*t* may include six conductive lines, and each of the second vias 130*v* may include three conductive lines.

The third wires 140, like the first wires 120, may extend along the film substrate 110. A plurality of third wires 140 may be provided to extend along the film substrate 110.

In an implementation, the third wires 140 may be first output wires of a semiconductor package. For example, the third wires 140 may include third wire terminals 140*t* and second connecting portions 140*c*.

The third wire terminals 140*t* may be the ends of the third wires 140 that are formed in the chip mounting region CR. For example, the third wire terminals 140*t* may be parts of the third wires 140 that are connected to the semiconductor chip 200 of FIG. 11.

In an implementation, as illustrated in FIGS. 1 and 3, the first wire terminals 120*t* and the third wire terminals 140*t* may be arranged in the first direction X1. The third wires 140 may extend from the third wire terminals 140*t* in a third direction X2, which is different from the first direction X1. The third direction X2 may be, e.g., a direction opposite (e.g. and parallel) to the first direction X1. The third wires 140 may extend along the first and second surfaces 110*a* and 110*b* of the package region PR.

The second connecting portions 140*c* may be parts of the third wires 140 that are formed in the package region PR. The second connecting portions 140*c* may be parts of the third wires 140 that are connected to a display panel 400 of FIG. 15. In an implementation, the second connecting portions 140*c* may be formed on the second surface 110*b* of a part of the package region PR adjacent to the second test region TR2.

The third wires 140 may further include third vias 140*v*. The third vias 140*v* may partially penetrate the film substrate 110. For example, the third vias 140*v* may be parts of the third wires 140 that penetrate the part of the package region PR adjacent to the second test region TR2.

The fourth wires 150, like the first wires 120, may extend along the film substrate 110. A plurality of fourth wires 150 may be provided to extend along the film substrate 110.

In an implementation, the fourth wires 150 may be second output wires of a semiconductor package. For example, the fourth wires 150 may include fourth wire terminals 150*t* and third connecting portions 150*c*.

The fourth wire terminals 150t may be the ends of the fourth wires 150 that are formed in the chip mounting region CR. For example, the fourth wire terminals 150t may be parts of the fourth wires 150 that are connected to the semiconductor chip 200 of FIG. 11.

In an implementation, as illustrated in FIGS. 1 and 3, the fourth wire terminals 150t may be disposed between the first wire terminals 120t and the third wire terminals 140t. In an implementation, the fourth wire terminals 150t may be disposed between the second wire terminals 130t and the third wire terminals 140t. Accordingly, the first wire terminals 120t, the third wire terminals 140t, and the fourth wire terminals 150t may be arranged in the first direction X1. In an implementation, the second wire terminals 130t, the third wire terminals 140t, and the fourth wire terminals 150t may be arranged in the first direction X1. The fourth wires 150 may extend from the fourth wire terminals 150t in the first direction X1 and may then extend in the third direction X2. The fourth wires 150 may extend along the first and second surfaces 110a and 110b of the package region PR.

The third connecting portions 150c may be parts of the fourth wires 150 that are formed in the package region PR. The third connecting portions 150c may be parts of the fourth wires 150 that are connected to the display panel 400 of FIG. 15. In an implementation, the third connecting portions 150c may be formed on the second surface 110b of the part of the package region PR adjacent to the second test region TR2. In an implementation, the second connecting portions 140c and the third connecting portions 150c may be arranged in the first direction X1. The second connecting portions 140c may be disposed closer to the second test region TR2 than the third connecting portions 150c (e.g., such that the second connecting portions 140c are between the second test region TR2 and the third connecting portions 150c).

The fourth wires 150 may further include fourth vias 150v. The fourth vias 150v may partially penetrate the film substrate 110. For example, the fourth vias 150v may be parts of the fourth wires 150 that penetrate the chip mounting region CR.

The first wires 120, the second wires 130, the third wires 140, and the fourth wires 150 may include, e.g., aluminum (Al) or copper (Cu). For example, the first wires 120, the second wires 130, the third wires 140, and the fourth wires 150 may be formed of Al or Cu foil.

The first wires 120, the second wires 130, the third wires 140, the fourth wires 150, the first connecting portions 120c, the second connecting portions 140c, and the third connecting portions 150c may be conductive wires that are partially plated. For example, the first wires 120, the second wires 130, the third wires 140, the fourth wires 150, the first connecting portions 120c, the second connecting portions 140c, and the third connecting portions 150c may be partially plated with at least one of tin (Sn), gold (Au), nickel (Ni), lead (Pb), or a combination thereof.

The first test pads 162 may be formed in the first test region TR1. The first test pads 162 may be electrically connected to the first wires 120. For example, the first test pads 162 may be formed on the second surface 110b of the first test region TR1. The first wires 120 may be electrically connected to the first test pads 162 via the first vias 120v.

In an implementation, the first wires 120 and the first test pads 162 may be separate elements. In an implementation, the first wires 120 and the first test pads 162 may be integrally formed. For example, the first test pads 162 may be parts of the first wires 120 that are plated.

The second test pads 164 may be formed in the first test region TR1. The second test pads 164 may be electrically connected to the second wires 130. For example, the second test pads 164 may be formed on the second surface 110b of the first test region TR1. The second extended portions 134 of the second wires 130 may be electrically connected to the second test pads 164.

In an implementation, the first test pads 162 and the second test pads 164 may be arranged in the first direction X1.

In an implementation, the second wires 130 and the second test pads 164 may be separate elements. In an implementation, the second wires 130 and the second test pads 164 may be integrally formed. For example, the second test pads 164 may be parts of the second wires 130 that are plated.

In an implementation, the third test pads 166 may be formed in the second test region TR2. In an implementation, the third test pads 166 may be formed in the first test region TR1 or in a region that is neither the first test region TR1 nor the second region TR2.

The third test pads 166 may be electrically connected to the third wires 140. For example, the third test pads 166 may be formed on the second surface 110b of the second test region TR2, and some of the third wires 140, which are formed on the second surface 110b of the package region PR, may be electrically connected to the third test pads 166.

In an implementation, the third wires 140 and the third test pads 166 may be separate elements. In an implementation, the third wires 140 and the third test pads 166 may be integrally formed. For example, the third test pads 166 may be parts of the third wires 140 that are plated.

In an implementation, the fourth test pads 168 may be formed in the first test region TR1. In an implementation, the fourth test pads 168 may be formed in the second test region TR2 or in a region that is neither the first test region TR1 nor the second region TR2.

The fourth test pads 168 may be electrically connected to the fourth wires 150. For example, the fourth test pads 168 may be formed on the second surface 110b of the first test region TR1, and some of the fourth wires 150, which are formed on the second surface 110b of the package region PR, may be electrically connected to the fourth test pads 168.

The fourth wires 150 and the fourth test pads 168 have been described as being separate elements, but the present disclosure is not limited thereto. For example, the fourth wires 150 and the fourth test pads 168 may be integrally formed. For example, the fourth test pads 168 may be parts of the fourth wires 150 that are plated.

The first and second resist films 172 and 174 may at least partially expose the first wires 120, the second wires 130, the third wires 140, and the fourth wires 150.

For example, the first resist film 172 may expose the first wire terminals 120t and the first connecting portions 120c of the first wires 120 and may also expose the second wire terminals 130t of the second wires 130, the third wire terminals 140t of the third wires 140, and the fourth wire terminals 150t of the fourth wires 150. Accordingly, the first wire terminals 120t, the second wire terminals 130t, and the third wire terminals 140t may be connected to the semiconductor chip 200 of FIG. 11, and the first connecting portions 120c may be connected to the printed circuit 300 of FIG. 15.

For example, the second resist film 174 may expose the second connecting portions 140c of the third wires 140 and may also expose the third connecting portions 150c of the fourth wires 150. Accordingly, the second connecting portions 140*c* and the third connecting portions 150*c* may be connected to the display panel 400 of FIG. 15.

In an implementation, the second resist film 174 may not expose the second extended portions 134 of the second wires 130. For example, the second resist film 174 may completely cover the second extended portions 134 of the second wires 130.

As electronic products have increasingly become compact in size, thin, and lightweight, the demand for films for compact package substrates for such electronic products has increased. The film according to some exemplary embodiments of the present disclosure may provide test wires that can avoid input wires. Thus, a film for a compact package substrate may be provided.

In an implementation, the second wires 130 that can avoid the first wires 120, which are formed on the first surface 110*a*, may be provided using the second vias 130*v*. This structure may provide a sufficiently large space for the first wires 120 on the first surface 110*a*. Accordingly, a minimum pitch can be secured between the first wires 120, and a film for a package substrate can be reduced in size.

Figure 6:
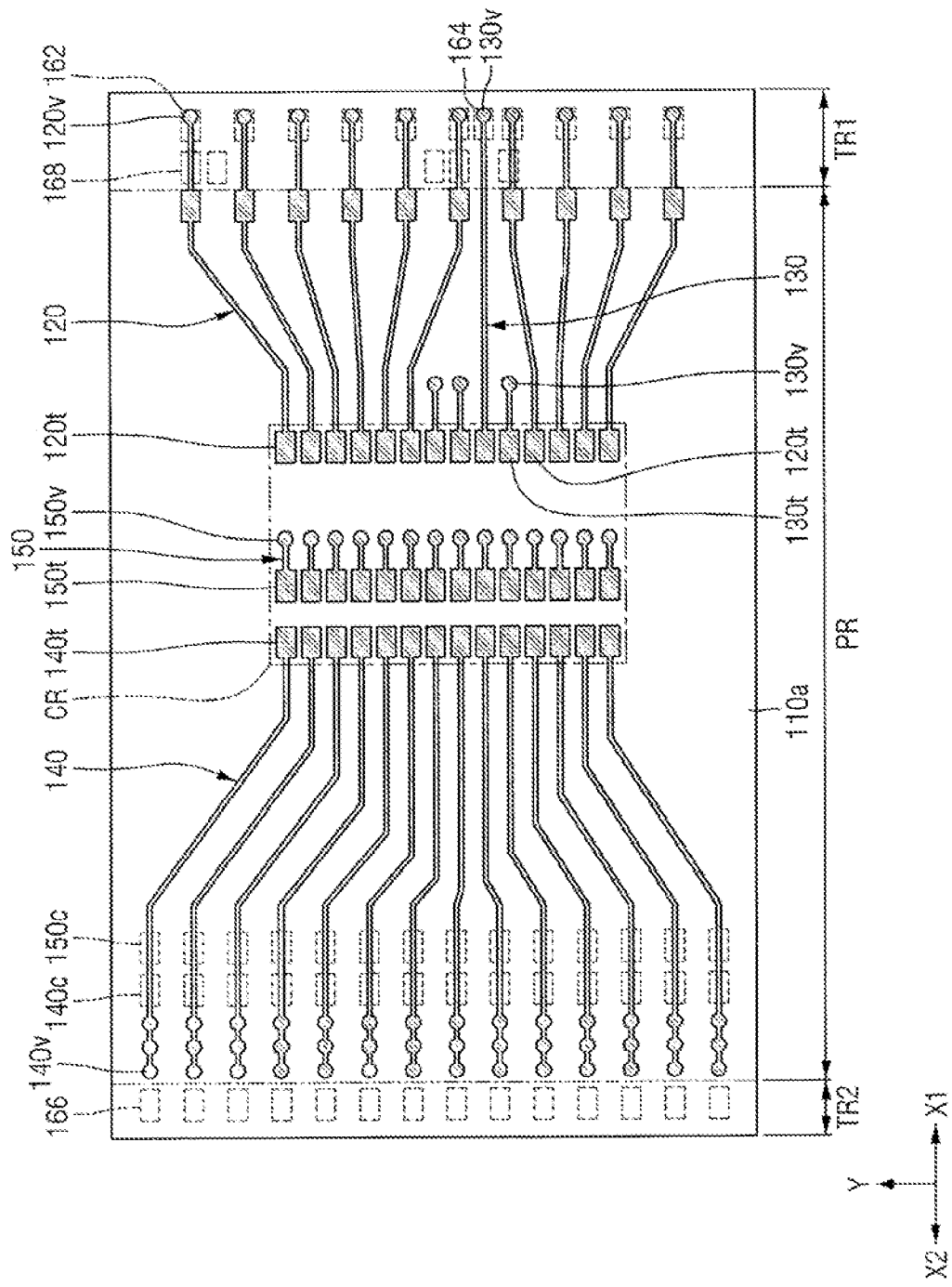
FIG. 6 illustrates a layout view of a film for a package substrate according to some exemplary embodiments of the present disclosure.

FIG. 6 illustrates a layout view of a film for a package substrate according to some exemplary embodiments of the present disclosure. For convenience, descriptions of elements or features that have already been described above with reference to FIGS. 1 through 5 may be omitted or at least simplified. FIG. 6 illustrates a first surface 110*a* of a film for a package substrate according to some exemplary embodiments of the present disclosure.

Referring to FIG. 6, some of a plurality of second vias 130*v* may not penetrate a package region PR.

For example, some of a plurality of second wires 130 may include second vias 130*v* that penetrate a test region TR1. Accordingly, some of the second wires 130 may extend along the first surface 110*a* of the package region PR and the first surface 110*a* of the first test region TR1. Some of the second wires 130 may include second vias 130*v* that penetrate the package region PR.

In an implementation, the second vias 130*v* that penetrate the first test region TR1 may be connected to second test pads 164.

In an implementation, some of the second test pads 164 may be arranged in parallel to first test pads 162. For example, some of the second test pads 164 may be arranged in a second direction Y together with the first test pads 162.

Figure 7:
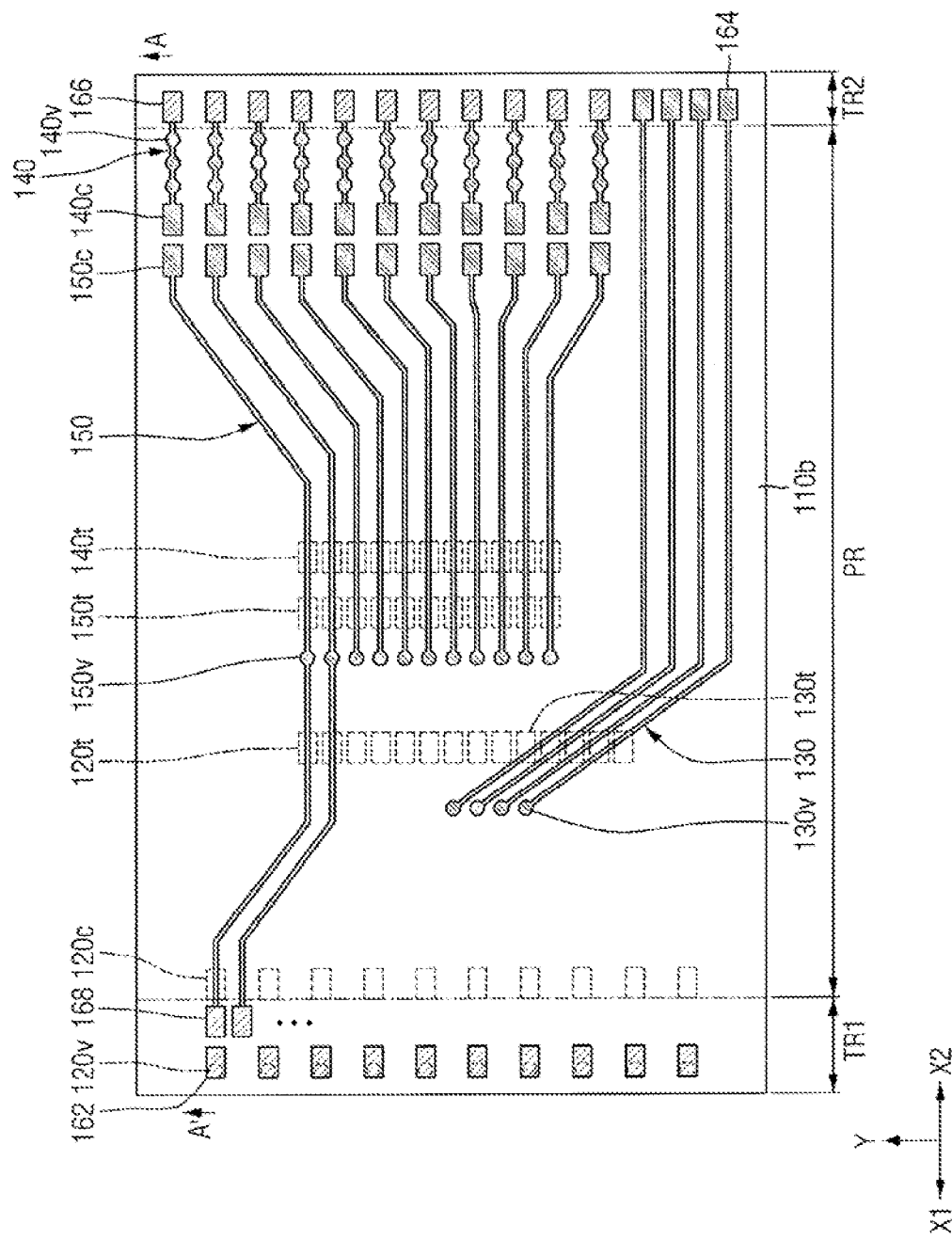
FIG. 7 illustrates a layout view of a film for a package substrate according to some exemplary embodiments of the present disclosure.

FIG. 7 illustrates a layout view of a film for a package substrate according to some exemplary embodiments of the present disclosure. For convenience, descriptions of elements or features that have already been described above with reference to FIGS. 1 through 5 may be omitted or at least simplified. FIG. 7 illustrates a second surface 110*b* of a film for a package substrate according to some exemplary embodiments of the present disclosure.

Referring to FIG. 7, second test pads 164 may be formed in a second test region TR2. The second test pads 164 may be electrically connected to second wires 130.

For example, the second test pads 164 may be formed on the second surface 110*b* of the second test region TR2. Second extended portions 134 of second wires 130 may be electrically connected to the second test pads 164.

For example, the second extended portions 134 may extend from second vias 130*v* in a third direction X2 and may be connected to the second test pads 164. Accordingly, the second extended portions 134 may extend from the second vias 130*v* to the edge of the package region PR on the second surface 110*b*.

Accordingly, the film according to the exemplary embodiment of FIG. 7 may secure a sufficiently large space in a first test region TR1 and may thus improve the characteristics of a semiconductor chip to be mounted thereon. For example, the film according to the exemplary embodiment of FIG. 7 may secure a space for forming a power region or a ground region in the test region TR1 and may thus improve the characteristics of a semiconductor chip to be mounted thereon.

Figure 8:
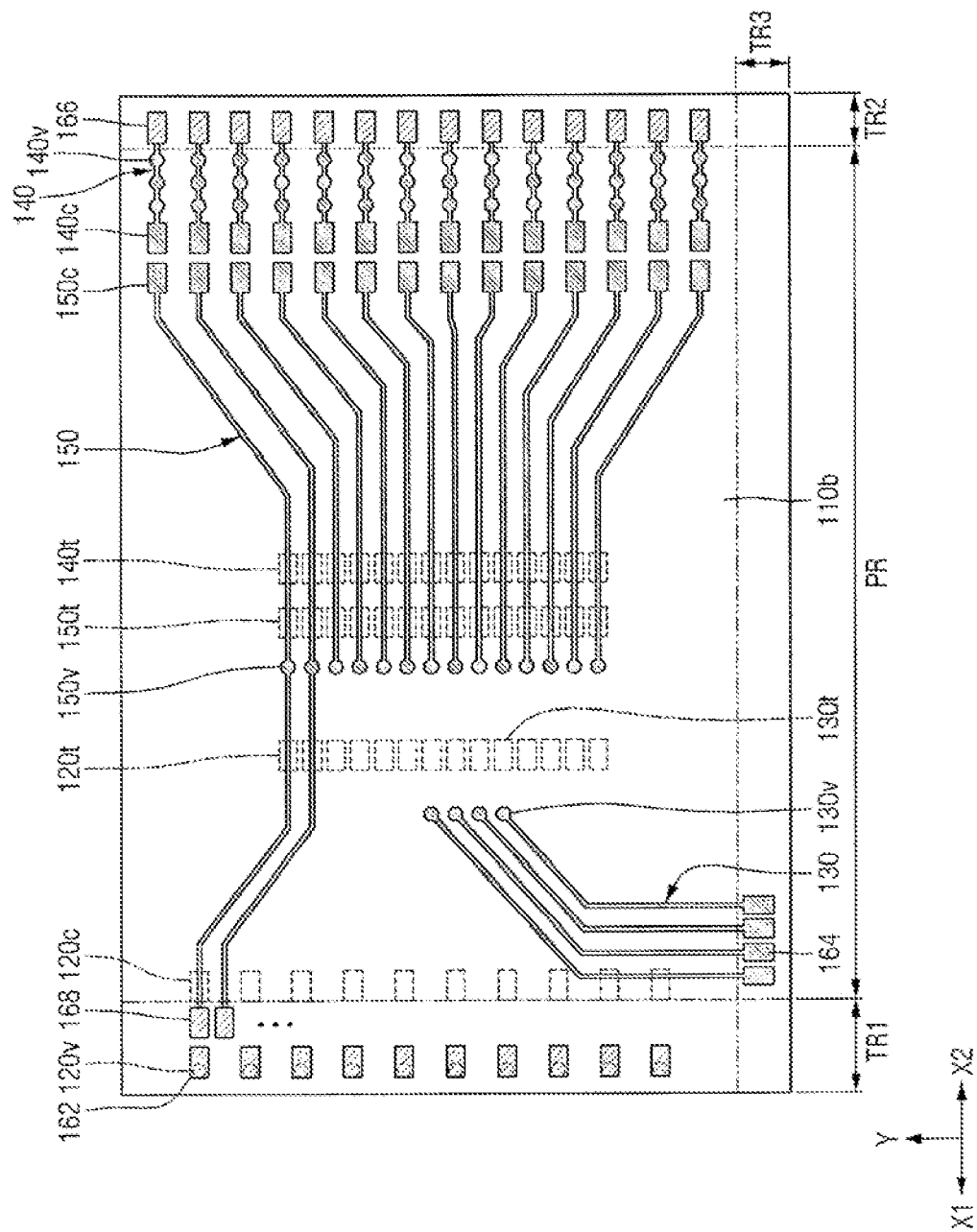
FIG. 8 illustrates a layout view of a film for a package substrate according to some exemplary embodiments of the present disclosure.

FIG. 8 illustrates a layout view of a film for a package substrate according to some exemplary embodiments of the present disclosure. For convenience, descriptions of elements or features that have already been described above with reference to FIGS. 1 through 5 may be omitted or at least simplified. FIG. 8 illustrates a second surface 110*b* of a film for a package substrate according to some exemplary embodiments of the present disclosure.

Referring to FIG. 8, a film substrate 110 may further include a third test region TR3.

The third test region TR3 may be adjacent to a package region PR. For example, the third test region TR3 may be formed along a side of the package region PR where first and second test regions TR1 and TR2 are not formed (e.g., between ends of the first and second test regions TR1 and TR2).

In an implementation, second test pads 164 may be formed in the third test region TR3. The second test pads 164 may be electrically connected to second wires 130.

For example, the second test pads 164 may be formed on the second surface 110*b* of the third test region TR3. Second extended portions 134 of the second wires 130 may be electrically connected to the second test pads 164. Accordingly, the second extended portions 134 may extend from second vias 130*v* to the edge of the package region PR on the second surface 110*b*.

Figure 9:
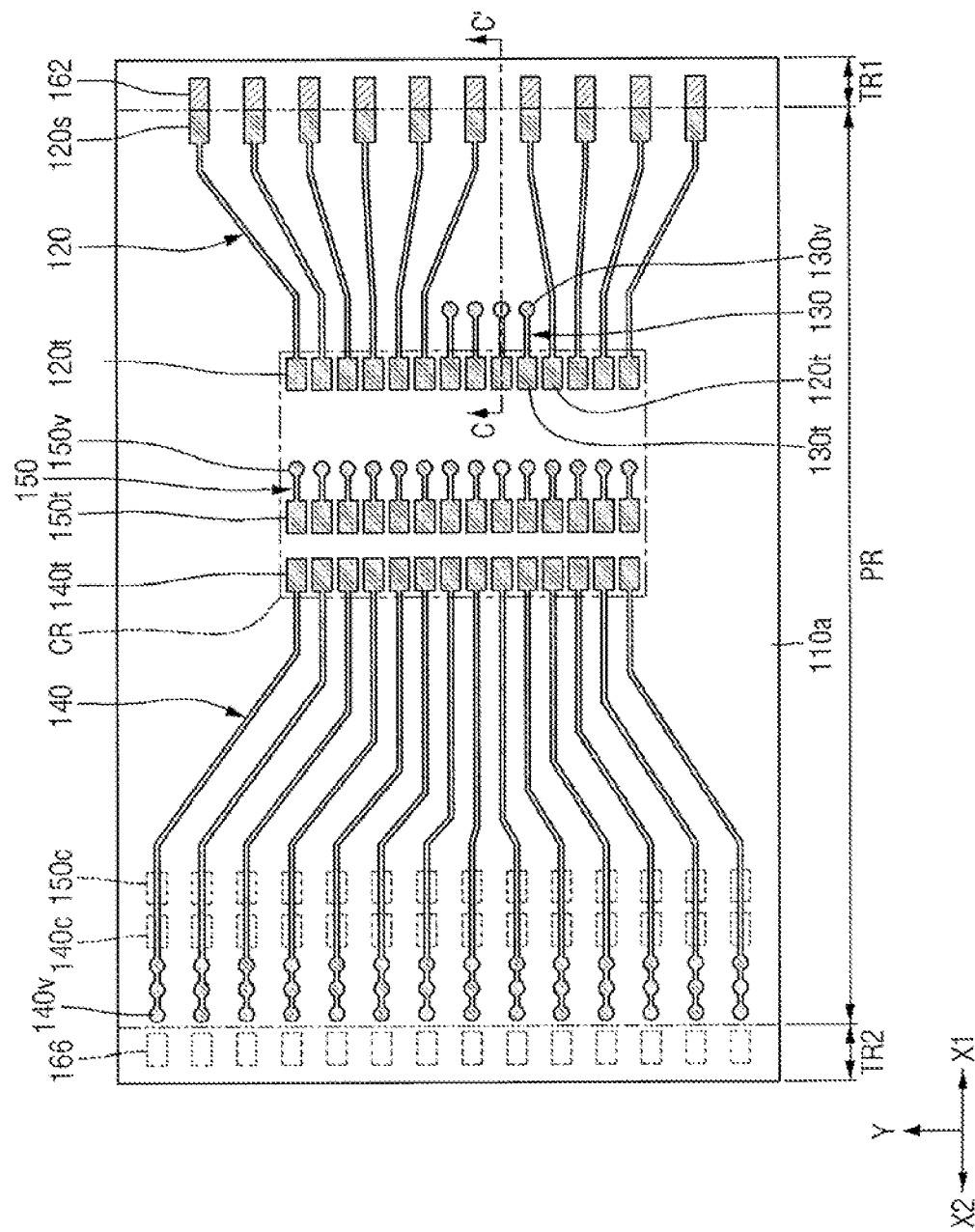
FIG. 9 illustrates a layout view of a film for a package substrate according to some exemplary embodiments of the present disclosure.
Figure 10:
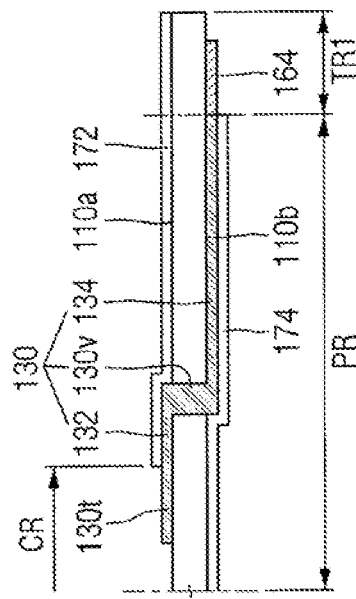
FIG. 10 illustrates a cross-sectional view taken along line C-C' of FIG. 9.

FIG. 9 illustrates a layout view of a film for a package substrate according to some exemplary embodiments of the present disclosure. FIG. 10 illustrates a cross-sectional view taken along line C-C' of FIG. 9. For convenience, descriptions of elements or features that have already been described above with reference to FIGS. 1 through 5 may be omitted or at least simplified. FIG. 9 illustrates a first surface 110*a* of a film for a package substrate according to some exemplary embodiments of the present disclosure.

Referring to FIGS. 9 and 10, first test pads 162 may be formed on the first surface 110*a* of a first test region TR1.

For example, the first test pads 162 may be adjacent to first connecting portions 120*c* of first wires 120. The first wires 120 may not include first vias 120*v*. Accordingly, the first wires 120 may extend along the first surface 110*a* of a package region PR and may be connected to the first test pads 162.

In an implementation, the first test pads 162 may overlap with second test pads 164. For example, as illustrated in FIG. 10, the first test pads 162, which are formed on the first surface 110*a* of the first test region TR1, may overlap with the second test pads 164, which are formed on a second surface 110*b* of the first test region TR1.

Semiconductor packages according to some exemplary embodiments of the present disclosure will hereinafter be described with reference to FIGS. 11 through 14.

FIGS. 11 and 12 illustrate cross-sectional views of a semiconductor package according to some exemplary embodiments of the present disclosure. For convenience, descriptions of elements or features that have already been described above with reference to FIGS. 1 through 10 may be omitted or at least simplified.

Referring to FIGS. 11 and 12, the semiconductor package according to some exemplary embodiments of the present disclosure may include a film for a package substrate and a semiconductor chip 200.

The film may be any one of the films that have been described above with reference to FIGS. 1 through 10.

The semiconductor chip 200 may be mounted on the film. For example, the semiconductor chip 200 may be mounted in a chip mounting region of a film substrate 110. In an implementation, the semiconductor chip 200 may include a display driver integrated circuit (DDI).

The semiconductor chip 200 may include a first chip pad 202, a second chip pad 204, a third chip pad 206, and a fourth chip pad 208.

The first chip pad 202 of the semiconductor chip 200 may be electrically connected to a first wire 120. For example, as illustrated in FIG. 11, the first chip pad 202 may be connected to the top surface of a first wire terminal 120t. Accordingly, the first wire 120 may extend from the first chip pad 202 in a first direction X1.

In an implementation, the first chip pad 202 may be an input terminal of a DDI. Accordingly, the input terminal of the semiconductor chip 200 may be connected to the first wire 120, which is an input wire.

The second chip pad 204 of the semiconductor chip 200 may be electrically connected to a second wire 130. For example, as illustrated in FIG. 12, the second chip pad 204 may be connected to the top surface of a second wire terminal 130t. Accordingly, a first extended portion 132 of the second wire 130 may extend from the second chip pad 204 in the first direction X1.

In an implementation, the second chip pad 204 may be a test terminal of a DDI. Accordingly, the test terminal of the semiconductor chip 200 may be connected to the second wire 130, which is a test wire. For example, the second chip pad 204 may be a test terminal used for testing a semiconductor package, rather than being an input or output terminal used for driving a display.

In an implementation, a second via 130v may penetrate a part of the package region PR between the semiconductor chip 200 and the first test region TR1.

The third chip pad 206 of the semiconductor chip 200 may be electrically connected to a third wire 140. For example, as illustrated in FIG. 11, the third chip pad 206 may be connected to the top surface of a third wire terminal 140t. Accordingly, the third wire 140 may extend from the third chip pad 206 in a third direction X2.

In an implementation, the third chip pad 206 may be a first output terminal of a DDI. Accordingly, the first output terminal of the semiconductor chip 200 may be connected to the third wire 140, which is a first output wire.

The fourth chip pad 208 of the semiconductor chip 200 may be electrically connected to a fourth wire 150. For example, as illustrated in FIG. 11, the fourth chip pad 208 may be connected to the top surface of a fourth wire terminal 150t. Accordingly, the fourth wire 150 may extend from the fourth chip pad 208.

In an implementation, the fourth chip pad 208 may be a second output terminal of a DDI. Accordingly, the second output terminal of the semiconductor chip 200 may be connected to the fourth wire 150, which is a second output wire.

Figure 14:
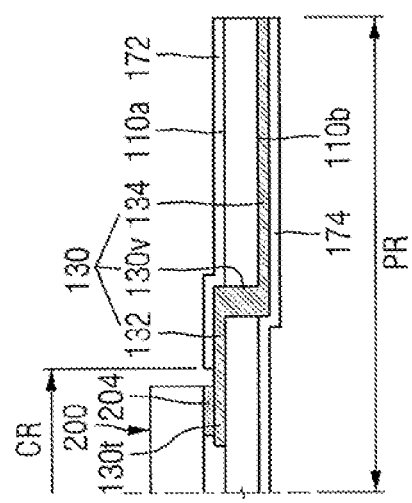

FIGS. 13 and 14 illustrate cross-sectional views of a semiconductor package according to some exemplary embodiments of the present disclosure. For convenience, descriptions of elements or features that have already been described above with reference to FIGS. 1 through 12 may be omitted or at least simplified.

Referring to FIGS. 13 and 14, the semiconductor package according to some exemplary embodiments of the present disclosure may not include a test region.

For example, a film substrate 110 may not include first and second test regions TR1 and TR2 that are adjacent to a package region PR. For example, the semiconductor package according to the exemplary embodiment of FIGS. 13 and 14 may be obtained by removing the first and second test regions TR1 and TR2 from the semiconductor package according to the exemplary embodiment of FIGS. 11 and 12.

Accordingly, as illustrated in FIG. 13, a first wire 120 may extend from a first chip pad 202 to the edge of a second surface 110b of a film substrate 110. A first connecting portion 120c of the first wire 120 may be disposed adjacent to the edge of the second surface 110b of the film substrate 110.

Also, as illustrated in FIG. 12, a second extended portion 134 of a second wire 130 may extend from a second via 130v to the edge of the second surface 110b of the film substrate 110. A second resist film 174 may completely cover the top surface of the second extended portion 134 of the second wire 130.

Display devices according to some exemplary embodiments of the present disclosure will hereinafter be described with reference to FIGS. 15 through 17.

Figure 15:
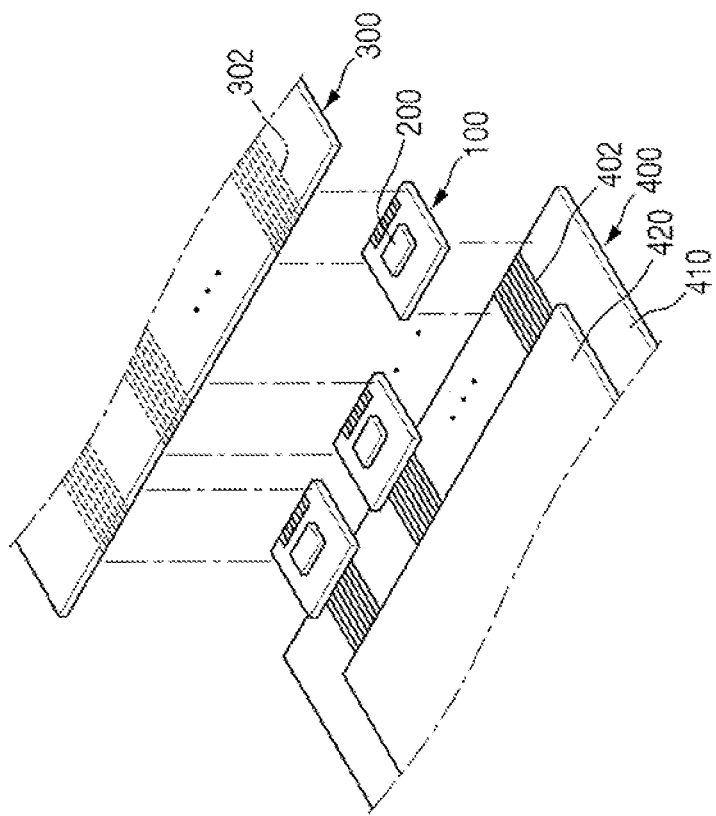
FIG. 15 illustrates a perspective view of a display device according to some exemplary embodiments of the present disclosure.

FIG. 15 illustrates a perspective view of a display device according to some exemplary embodiments of the present disclosure. FIG. 16 illustrates a cross-sectional view of the display device according to some exemplary embodiments of the present disclosure. For convenience, descriptions of elements or features that have already been described above with reference to FIGS. 1 through 14 may be omitted or at least simplified.

Figure 16:
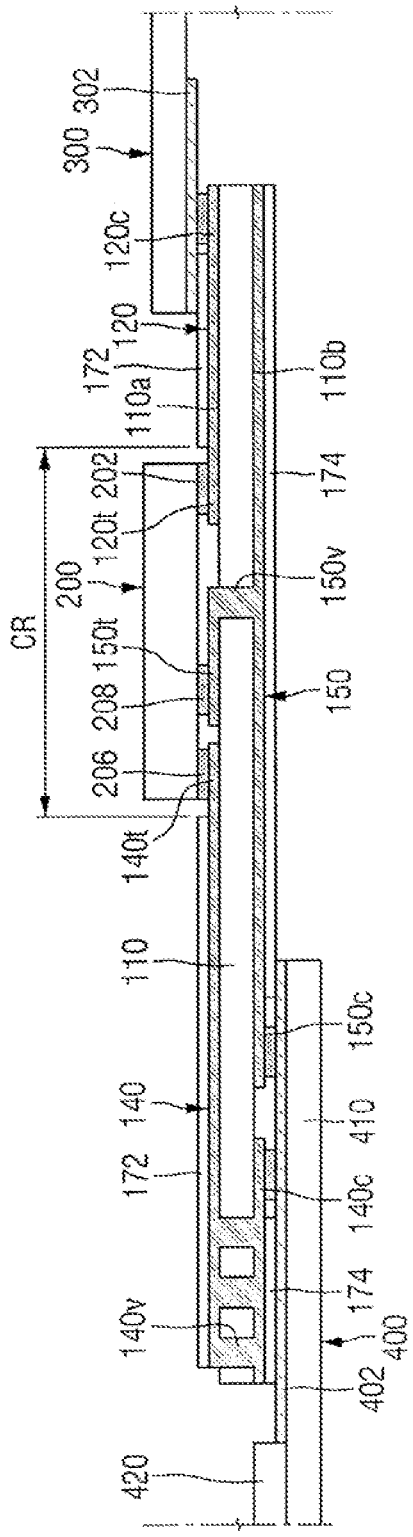
FIG. 16 illustrates a cross-sectional view of the display device according to some exemplary embodiments of the present disclosure.

Referring to FIGS. 15 and 16, the display device according to some exemplary embodiments of the present disclosure may include semiconductor packages 100, a printed circuit 300, and a display panel 400.

The semiconductor packages 100 may be electrically connected to the printed circuit 300 and the display panel 400. Each of the semiconductor packages 100 may receive signals provided by the printed circuit 300 and may output the received signals to the display panel 400.

The semiconductor packages 100 may be chip-on-film (COF) semiconductor packages. For example, the semiconductor packages 100 may have semiconductor chips 200 mounted thereon. The semiconductor chips 200 may realize colors by controlling a plurality of pixels of the display panel 400. In an implementation, the semiconductor chips 200 may be DDIs. Each of the semiconductor packages 100 may be any one of the semiconductor packages that have been described above with reference to FIGS. 11 through 14.

The printed circuit 300 may be connected to first sides of the semiconductor packages 100. For example, the printed circuit 300 may include printed circuit wires 302, which are formed on the surface of the printed circuit 300. Each of the printed circuit wires 302 of the printed circuit 300 may be electrically connected to a first connecting portion 120c of a first wire 120. The printed circuit 300 may be, e.g., a flexible printed circuit (FPC).

In an implementation, the printed circuit 300 may include one or more driver integrated circuit (IC) chips that apply power and signals at the same time to the semiconductor packages 100.

The display panel 400 may be connected to second sides of the semiconductor packages 100. For example, the display panel 400 may include display panel wires 402, which are formed on the surface of the display panel 400. Each of the display panel wires 402 may be electrically connected to a second connecting portion 140c of a third wire 140 and a third connecting portion 150c of a fourth wire 150.

The display panel 400 may include a display substrate 410 and an image region 420, which is formed on the display substrate 410. The display substrate 410 may be, e.g., a glass substrate or a flexible substrate. In the image region 420, a plurality of pixels may be formed. The pixels of the image region 420 may operate in accordance with signals provided by the semiconductor packages 100.

The semiconductor packages 100 may be electrically connected to the display panel 400 and may perform the functions of a gate driver or a source driver. For example, the semiconductor packages 100 may be connected to gate lines of the display panel 400 and may perform the functions of a gate driver. Alternatively, the semiconductor packages 100 may be connected to source lines of the display panel 400 and may perform the functions of a source driver.

The display panel 400 may include, e.g., at least one of a liquid crystal display (LCD) panel, a light-emitting diode (LED) panel, an organic LED (OLED) panel, and a plasma display panel (PDP).

In an implementation, a single semiconductor package 100 may be connected between the printed circuit 300 and the display panel 400. For example, in a case where the display panel 400 is for providing a small-size screen such as that of a mobile phone or for supporting low resolution, the display device according to some exemplary embodiments of the present disclosure may include only one semiconductor package 100.

In an implementation, a plurality of semiconductor packages 100 may be connected between the printed circuit 300 and the display panel 400. For example, in a case where the display panel 400 is for providing a large-size screen such as that of a television (TV) or for supporting high resolution, the display device according to some exemplary embodiments of the present disclosure may include a plurality of semiconductor packages 100.

Figure 17:
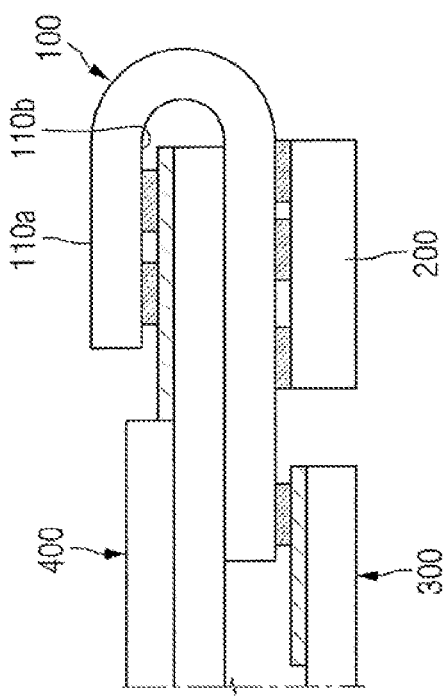
FIG. 17 illustrates a cross-sectional view of a display device according to some exemplary embodiments of the present disclosure.

FIG. 17 illustrates a cross-sectional view of a display device according to some exemplary embodiments of the present disclosure. For convenience, descriptions of elements or features that have already been described above with reference to FIGS. 1 through 16 may be omitted or at least simplified.

Referring to FIG. 17, a semiconductor package 100 may be partially bent.

For example, a part of the semiconductor package 100 that is adjacent to a display panel 400 may be bent. Accordingly, a printed circuit 300 and the display panel 400 may face each other. In an implementation, a second surface 110b of the semiconductor package 100 may be placed in contact with the bottom surface of the display panel 400. In an implementation, a semiconductor chip 200 may be disposed below the display panel 400.

Accordingly, the display device according to some exemplary embodiments of the present disclosure may contribute to reducing the size of an electronic product. For example, in a case where the display panel 400 is applied to a mobile phone or a TV, the bezel size of the mobile phone or the TV may be reduced.

A method of fabricating a film for a package substrate according to some exemplary embodiments of the present disclosure will hereinafter be described with reference to FIGS. 1 through 5 and 18 through 20.

Figure 18:
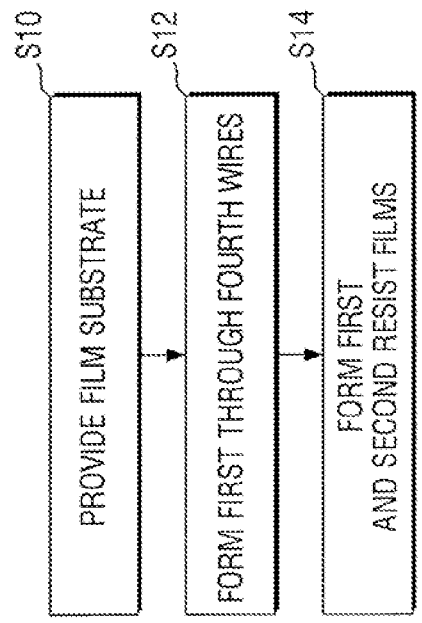
FIG. 18 illustrates a flowchart of a method of fabricating a film for a package substrate according to some exemplary embodiments of the present disclosure.
Figure 19:
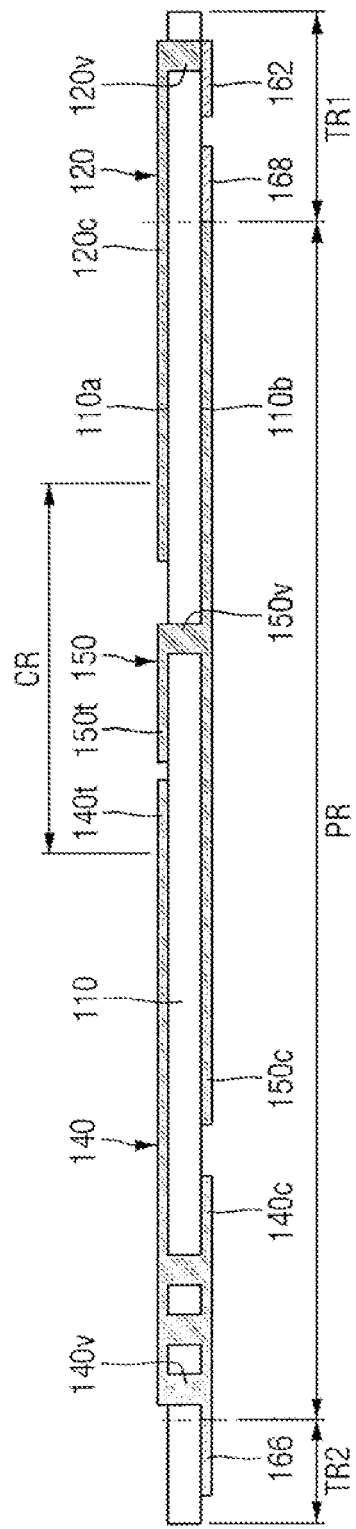
FIGS. 19 and 20 illustrate cross-sectional views of stages in the method of fabricating a film for a package substrate according to some exemplary embodiments of the present disclosure.
Figure 20:
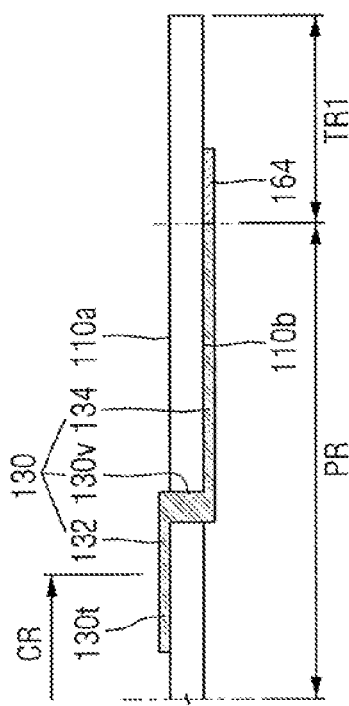

FIG. 18 illustrates a flowchart of a method of fabricating a film for a package substrate according to some exemplary embodiments of the present disclosure. FIGS. 19 and 20 illustrate cross-sectional views of stages in the method of fabricating a film for a package substrate according to some exemplary embodiments of the present disclosure. For convenience, descriptions of elements or features that have already been described above with reference to FIGS. 1 through 17 may be omitted or at least simplified.

Referring to FIGS. 18 through 20, a film substrate 110 may be provided (S10).

The film substrate 110 may include first and second surfaces 110a and 110b, which are opposite to each other.

The film substrate 110 may further include a package region PR, a first test region TR1, and a second test region TR2. The package region PR may be adjacent to both the first and second test regions TR1 and TR2.

Thereafter, first, second, third, and fourth wires 120, 130, 140, and 150 may be formed (S12).

For example, the first, second, third, and fourth wires 120, 130, 140, and 150 may be formed by patterning a metal layer. The patterning of the metal layer may be performed by, e.g., casting, laminating, or electroplating.

In an implementation, first, second, third, and fourth test pads 162, 164, 166, and 168 may be formed together with the first, second, third, and fourth wires 120, 130, 140, and 150. For example, the first, second, third, and fourth test pads 162, 164, 166, and 168 may be integrally formed with the first, second, third, and fourth wires 120, 130, 140, and 150, respectively.

Referring to FIGS. 1 through 5 and 18, first and second resist films 172 and 174 may be formed (S14).

For example, solder resist may be applied on the film substrate 110 through screen printing or inkjet printing. For example, photo-imageable solder resist may be applied on the entire film substrate 110 through screen printing or spray coating. In an implementation, a film-type solder resist material may be attached on the film substrate 110 through laminating.

Thereafter, unnecessary parts of the solder resist formed on the film substrate 110 may be removed by exposure or development. For example, solder resist may be formed on the film substrate 110 to at least partially expose the first, second, third, and fourth wires 120, 130, 140, and 150.

Thereafter, the solder resist formed on the film substrate 110 may be cured by, e.g., heat, ultraviolet (UV) light, or infrared (IR) light.

As a result, the first resist film 172 may be formed to expose a first wire terminal 120t, a first connecting portion 120c, a second wire terminal 130t, a third wire terminal 140t, and a fourth wire terminal 150t.

Also, the second resist film 174 may be formed to expose second and third connecting portions 140c and 150c. In an implementation, the second resist film 174 may not expose a second extended portion 134 of the second wire 130.

A method of fabricating a semiconductor package according to some exemplary embodiments of the present disclosure will hereinafter be described with reference to FIGS. 11 through 14 and 19.

Figure 21:
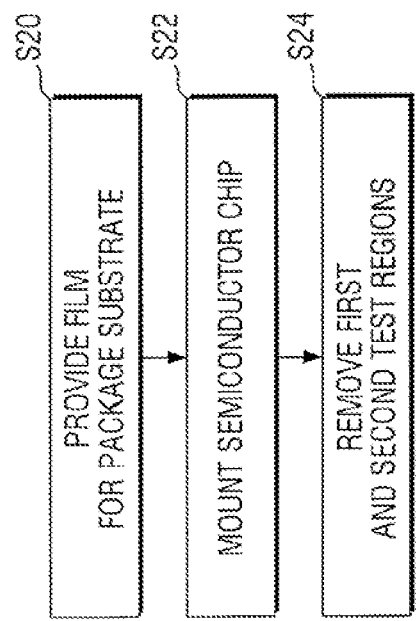
FIG. 21 illustrates a flowchart of a method of fabricating a semiconductor package according to some exemplary embodiments of the present disclosure.

FIG. 21 illustrates a flowchart of a method of fabricating a semiconductor package according to some exemplary embodiments of the present disclosure. For convenience, descriptions of elements or features that have already been described above with reference to FIGS. 1 through 20 may be omitted or at least simplified.

Referring to FIG. 21, a film for a package substrate may be provided (S20).

The film may be any one of the films that have been described above with reference to FIGS. 1 through 10.

The film may be formed by, e.g., the method of fabricating a film for a package substrate according to the exemplary embodiment of FIG. 18.

Referring to FIGS. 11, 12, and 21, a semiconductor chip 200 may be mounted on the film (S22).

For example, the semiconductor chip 200 may be mounted in a chip mounting region CR of a film substrate 110. In an implementation, the semiconductor chip 200 may be a DDI.

A first chip pad 202 of the semiconductor chip 200 may be electrically connected to a first wire 120. A second chip pad 204 of the semiconductor chip 200 may be electrically connected to a second wire 130. A third chip pad 206 of the semiconductor chip 200 may be electrically connected to a third wire 140. A fourth chip pad 208 of the semiconductor chip 200 may be electrically connected to a fourth wire 150.

Referring to FIGS. 13, 14, and 21, first and second test regions TR1 and TR2 of the film may be removed (S24).

Before the removal of the first and second test regions TR1 and TR2, the characteristics of the semiconductor chip 200 may be tested.

For example, the characteristics of the semiconductor chip 200 may be tested using a measurement apparatus having a probe. For example, the measurement apparatus may be provided on a second surface 110b of the film substrate 110. Thereafter, the probe of the measurement apparatus may be placed in contact with the first test pad 162, the second test pad 164, the third test pad 166, and/or the fourth test pad 168 to test the characteristics of the semiconductor chip 200.

A method of fabricating a display device according to some exemplary embodiments of the present disclosure will hereinafter be described with reference to FIGS. 15 through 17 and 22.

Figure 22:
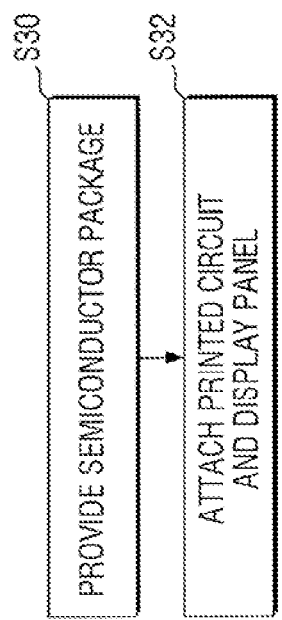
FIG. 22 illustrates a flowchart of a method of fabricating a display device according to some exemplary embodiments of the present disclosure.

FIG. 22 illustrates a flowchart of a method of fabricating a display device according to some exemplary embodiments of the present disclosure. For convenience, descriptions of elements or features that have already been described above with reference to FIGS. 1 through 21 may be omitted or at least simplified.

Referring to FIG. 22, a semiconductor package 100 may be provided (S30).

The semiconductor package 100 may be any one of the semiconductor packages that have been described above with reference to FIGS. 11 through 14.

Thereafter, a printed circuit 300 and a display panel 400 may be attached to the semiconductor package 100 (S32).

For example, as illustrated in FIGS. 15 and 16, the printed circuit 300 may be formed to be electrically connected to a first connecting portion 120c of a first wire 120, and the display panel 400 may be formed to be electrically connected to a second connecting portion 140c of a third wire 140 and a third connecting portion 150c of a fourth wire 150.

Thereafter, the semiconductor package 100 may be partially bent, as illustrated in FIG. 17. For example, a part of the semiconductor package 100 that is adjacent to the display panel 400 may be bent. As a result, a display device having the printed circuit 300 and the display panel 400 face each other can be fabricated.

By way of summation and review, fine wire patterns may be formed in the COF package, and the COF package has drawn attention as a high-integration density package.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A film for a package substrate, the film comprising:
a film substrate including a package region, a first test region, and a second test region, the first test region and the second test region being adjacent to both sides of the package region, the film substrate having a first surface and a second surface, the first surface being opposite to the second surface relative to a thickness direction of the film substrate;
a chip mounting region disposed on the first surface of the package region;
a first wire including a first wire terminal, which is disposed in the chip mounting region;
a second wire including a second wire terminal, which is disposed in the chip mounting region, and spaced apart from the first wire terminal in a first direction;
a third wire including a third wire terminal, which is disposed in the chip mounting region, and spaced apart from the first wire terminal in a second direction, which intersects the first direction;
a first test pad and a second test pad disposed on the second surface of the first test region; and
a third test pad disposed on the second surface of the second test region,
wherein:
the first wire includes a first via that penetrates the first test region and that is connected to the first test pad,
the second wire includes a second via that penetrates a part of the package region between the chip mounting region and the first test region and that is connected to the second test pad, and
the third wire is connected to the third test pad.

2. The film as claimed in claim 1, wherein the third wire includes a third via that penetrates the package region and that is connected to the third test pad.

3. The film as claimed in claim 1, further comprising a fourth wire including a fourth wire terminal, which is disposed in the chip mounting region,
wherein the fourth wire terminal is disposed between the first and third wire terminals.

4. The film as claimed in claim 3, further comprising a fourth test pad disposed on the second surface of the first test region,
wherein the fourth wire includes a fourth via that penetrates the chip mounting region and that is connected to the fourth test pad.

5. The film as claimed in claim 4, wherein the second test pad and the fourth test pad are arranged in the first direction.

6. The film as claimed in claim 1, wherein the first test pad and the second test pad are arranged in the second direction.

7. A film for a package substrate, the film comprising:
a film substrate including a first surface and a second surface, the first surface being opposite to the second surface relative to a thickness direction of the film substrate;
a chip mounting region disposed on the first surface;

a first wire including a first wire terminal, which is disposed in the chip mounting region, and a connecting portion, which extends from the first wire terminal on the first surface along a second direction, which intersects a first direction; and a second wire including:
a second wire terminal, which is disposed in the chip mounting region, and spaced apart from the first wire terminal in the first direction,
a first extended portion, which extends along the first surface,
a second extended portion, which extends along the second surface, and
a first via, which penetrates the film substrate and connects the first extended portion and the second extended portion, wherein:
the first extended portion extends from the second wire terminal in the second direction and is connected to the first via, and
the second extended portion extends from the first via to an edge of the second surface.

8. The film as claimed in claim 7, wherein the second extended portion extends in the second direction.

9. The film as claimed in claim 7, wherein:
the second extended portion at least partially overlaps with the first wire in the thickness direction of the film substrate, and
the first extended portion does not overlap with the first wire in the thickness direction of the film substrate.

10. The film as claimed in claim 7, further comprising a resist film, wherein:
the connecting portion is adjacent to an edge of the first surface, and
the resist film exposes a top surface of the connecting portion.

11. The film as claimed in claim 7, further comprising a resist film completely covering a top surface of the second extended portion.

12. The film as claimed in claim 7, further comprising a third wire including:
a third wire terminal, which is disposed in the chip mounting region, and spaced apart from the first wire terminal in the second direction, and
a second connecting portion, which extends from the third wire terminal.

13. A film for a package substrate, the film comprising:
a film substrate including a package region and a first test region, which are adjacent to each other, the film substrate including a first surface and a second surface, the first surface being opposite to the second surface relative to a thickness direction of the film substrate;
a chip mounting region disposed on the first surface;
a first test pad disposed on the second surface of the first test region;
a first wire disposed on the first surface of the package region and the first surface of the first test region; and
a second wire connected to the first test pad, wherein the first wire includes a first wire terminal, which is disposed in the chip mounting region, and a connecting portion, which extends from the first wire terminal in a second direction that intersects a first direction, wherein the second wire includes a second wire terminal, which is disposed in the chip mounting region, and a first via that penetrates a part of the package region between the chip mounting region and the first test region, and wherein the first wire terminal and the second wire terminal spaced apart from each other in the first direction.

14. The film as claimed in claim 13, wherein:
the first wire terminal is connected to an input terminal of a semiconductor chip, and
the second wire terminal is connected to a test terminal of the semiconductor chip.

15. The film as claimed in claim 14, wherein the semiconductor chip is a display driver integrated circuit (DDI).

16. The film as claimed in claim 13, wherein:
the second wire further includes:
a first extended portion that extends along the first surface of the package region, and
a second extended portion that extends along the second surface of the package region,
the first extended portion connects the first wire terminal and the first via, and
the second extended portion connects the first via and the first test pad.

17. The film as claimed in claim 13, further comprising a second test pad disposed on the second surface of the first test region,
wherein the first wire is connected to the second test pad.

18. The film as claimed in claim 17, wherein:
the first wire further includes a second via that penetrates the first test region, and
the second via is connected to the second test pad.

19. The film as claimed in claim 17, wherein the first test pad and the second test pad are spaced apart arranged in the second direction.

20. The film as claimed in claim 13, further comprising:
a second test pad; and
a third wire,
wherein:
the film substrate further includes a second test region that is adjacent to the package region and is spaced apart from the first test region,
the third wire includes a third wire terminal, which is disposed in the chip mounting region, and spaced apart from the first wire terminal in the second direction,
the second test pad is disposed on the second surface of the second test region, and
the third wire is connected to the second test pad.

* * * * *